United States Patent

[11] 3,562,610

[72] Inventor Thomas G. Stehney
Rillton, Pa.

[21] Appl. No. 841,689
[22] Filed July 1, 1969
[45] Patented Feb. 9, 1971
[73] Assignee Westinghouse Electric Corporation
Pittsburgh, Pa.
Continuation of application Ser. No. 641,367, May 25, 1967, now abandoned.

[54] CONTROLLED RECTIFIER WITH IMPROVED SWITCHING CHARACTERISTICS
1 Claim, 5 Drawing Figs.

[52] U.S. Cl. .......... 317/235, 317/234, 29/591, 148/177
[51] Int. Cl. .......... H01l 11/00
[50] Field of Search .......... 317/235/22, 41.1, 41.13, 41

[56] References Cited

UNITED STATES PATENTS

| | | | |
|---|---|---|---|
| 2,861,018 | 11/1958 | Fuller et al. | 148/1.5 |
| 2,988,677 | 6/1966 | Miller | 317/234 |
| 3,337,782 | 8/1967 | Todaro, Jr | 317/235 |
| 3,044,147 | 7/1962 | Armstrong | 29/253 |
| 3,239,728 | 3/1966 | Aldrich et al. | 317/235 |
| 3,280,386 | 10/1966 | Philips | 317/234 |
| 3,356,862 | 10/1966 | Diebold et al. | 307/88.5 |
| 3,331,000 | 7/1967 | Moysen et al. | 317/235 |
| 3,362,858 | 1/1968 | Knopp | 317/235 |

*Primary Examiner*—John W. Huckert
*Assistant Examiner*—Barry Estrin
*Attorneys*—F. Shopoe and C. L. Menzemer

ABSTRACT: This invention relates to a gate controlled PNPN semiconductor device having turnoff capability, and more particularly to a turnoff thyristor having both low current gain characteristics and high reverse gate to cathode emitter voltage characteristics. In this device an emitter region is formed in a base region by diffusion and gate contacts are alloyed through the emitter region to the base region.

WITNESSES:
Bernard R. Gieguez
James F. Young

INVENTOR
Thomas G. Stehney
BY
C. L. Menzemer
ATTORNEY

CONTROLLED RECTIFIER WITH IMPROVED SWITCHING CHARACTERISTICS

This is a continuation of Pat. No. 641,367 filed May 25, 1967 and now abandoned.

BACKGROUND OF THE INVENTION

The conventional semiconductor controlled rectifier is a solid state semiconductor NPNP four layer device having anode, cathode and gate electrodes. The controlled rectifier, in its normal state, will block an applied voltage in either direction; but when an appropriate voltage or current pulse is applied to the gate electrode, current will flow between the anode and cathode, thus turning on power to a load circuit. When the polarity of the applied voltage is reversed, the device will again block, but it cannot be turned on. It is equivalent to a rectifier except that the gate can control the start of conduction at a predetermined time, however, once conduction starts the gate exercises no further control.

The usual semiconductor controlled rectifier is similar in operation to a thyratron and is characterized in that once it is fired or driven into conduction by application of current to its gate electrode, the gate loses control and the rectifier can be turned off only by reducing the load current to zero.

The gate controlled switch has all the basic features of the semiconductor controlled rectifier but it does not lose control after the device is in the "ON" state. In such a device the load current can be turned off by applying a reverse pulse of relatively small magnitude to the gate. Such a device is somewhat similar to a switching transistor in performance except that it does not require a continuous control current to maintain the conduction state.

To have good turnoff characteristics in a gate controlled switch it is necessary to have good reverse current and voltage characteristics at the gate-cathode emitter junction and at the same time have low current gain characteristics. Obtaining both of these characteristics simultaneously, however, is a difficult problem.

SUMMARY OF THE INVENTION

In accordance with the invention a gate controlled switch is provided in which both low current gain characteristics and good reverse blocking voltage characteristics at the gate-cathode emitter junction are obtained simultaneously. This is accomplished by providing a diffused gate-cathode emitter junction and thereafter alloying gate contacts through the cathode emitter region into the gate region.

An object of the invention is to provide a new and improved gate control switch or turnoff thyristor in which the gate-cathode emitter junction has good reverse blocking voltage characteristics while at the same time the device has low current gain.

Other objects of the invention will, in part, be obvious and will, in part, appear hereinafter.

DESCRIPTION OF THE PREFERRED EMBODIMENT

Figure 1:
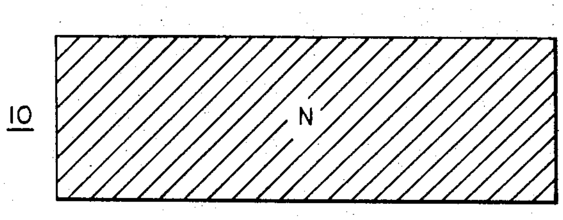
FIGS. 1—4 are side views in cross section of a body of semiconductor material being processed in accordance with the teachings of this invention.
Figure 2:
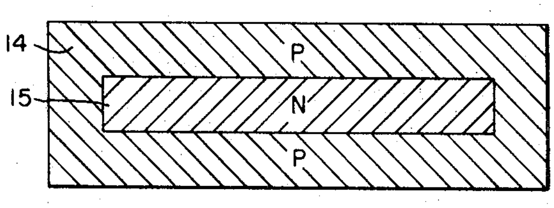
Figure 3:
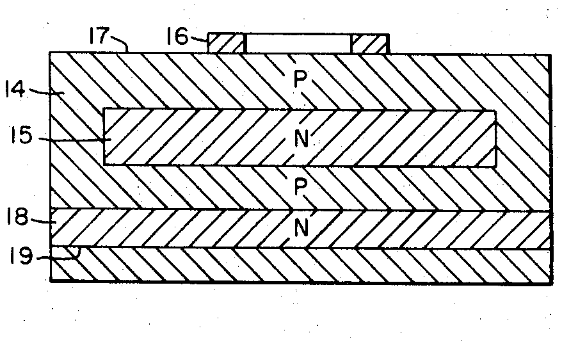

With reference to FIG. 1, there is shown a wafer 10 of N-type silicon suitable for use in preparing a semiconductor device in accordance with the teachings of this invention. With reference to FIG. 2, a P-type impurity is diffused into the periphery of the wafer 10 to produce a P-type region 14 completely enclosing and surrounding an inner N-type region 15. With reference to FIG. 3, following the diffusion step a gold ring 16 is alloyed onto the top surface 17 of the wafer 10. An N-type region 18 is simultaneously formed by alloying onto the bottom surface 19 of the wafer 10 a gold N-type dopant alloy. The ring 16 forms the cathode emitter contact for the gate controlled switch and region 18 forms the anode emitter for the gate controlled switch. The assembly thus formed is a four layer PNPN device.

Figure 4:
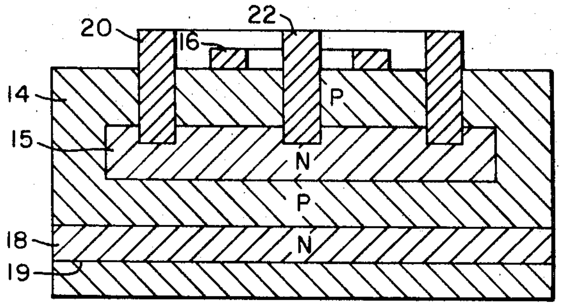

With reference to FIG. 4, following the alloying of the contact 16 and the formation of N-type region 18, N-type contacts consisting of a ring shaped member 20 and a dot shaped member 22 are alloyed through the upper P-type layer 14. The ring member 20 and dot member 22 may for example, comprise gold containing antimony which is alloyed through the diffused layer 14 to make contact with the inner N-type region 15.

Figure 5:
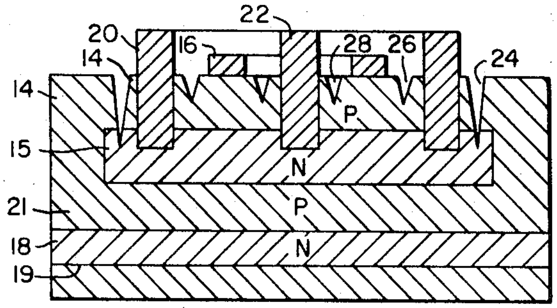
FIG. 5 is a cross-sectional view of a completed gate controlled switch prepared in accordance with the teachings of this invention.

With reference to FIG. 5, grooves 24, 26 and 28 are etched into the upper surface of the P-type layer 14. The outer peripheral groove 24 is deep enough to intersect the N-type region 15 and thereby separate the upper portion of the P-type region 14 from the lower portion.

The two concentric rings 26 and 28 are formed on either side of the contact ring 16. The purpose of the grooves 26 and 28 is to remove the high conductivity region from the top of the diffused layer which, of course, would reduce the gate-emitter breakdown voltage. These grooves, as well as the grooves 24 are easily etched by masking all of the unit with wax except the annular areas of the grooves. The entire unit can then be immersed in acid for a time sufficient to produce the desired groove depth.

In the completed device shown in FIG. 5, the N-type region 18 forms the anode emitter for the gate controlled switch, while the lower portion 21 of region 14 which is separated from the upper portion 14 by means of the groove 24 forms the base of the controlled rectifier. The N-type region 15 forms the gate which is connected to an external circuit through the N-type contacts 20 and 22 alloyed through the upper P-type region 14. The P-type region 14 which is separated from the lower portion 21 by the groove 24, comprises the cathode-emitter of the device and is connected to an external circuit through the contact ring 16.

With the construction shown, and since the PN junction between the gate region 15 and the cathode-emitter region 14 is a diffused region, extremely high reverse gate to emitter voltage characteristics can be achieved to facilitate turnoff of the device. Low current gain for the unit can be achieved by proper selection of diffusion depth, surface concentration, crystal thickness and gold penetration. Thus, the unit exhibits excellent turnoff characteristics because of its high reverse gate to cathode emitter voltage and low current gain.

Although the invention has been described in connection with certain specific embodiments, it will be readily apparent to those skilled in the art that various changes may be made therein without departing from the spirit and scope of the invention.

I claim:

1. A gate controlled PNPN semiconductor switch comprising, a wafer of semiconductive material of a first conductivity type having therein a diffused region of a second type conductivity, a PN junction between an emitter region and a base region of said gate controlled switch, and gate contact means alloyed through said diffused emitter layer region to make contact with said base region of the gate controlled switch, said contact means comprising a central dot alloyed through the emitter region together with a surrounding ring also alloyed through the diffused emitter region, a metallic annular emitter contact disposed between said gate contact dot and ring and alloyed to the surface of said emitter region, and a first annular groove in the surface of said emitter region between the emitter contact and said ring gate contact, and a second annular groove in the surface of said emitter region between the emitter contact and said gate dot contact.